United States Patent [19]

Kuhn-Kuhnenfeld et al.

[11] Patent Number: 4,522,656

[45] Date of Patent: Jun. 11, 1985

[54] METHOD OF MAKING REFERENCE SURFACE MARKINGS ON SEMICONDUCTOR WAFERS BY LASER BEAM

[75] Inventors: Franz Kuhn-Kuhnenfeld, Emmerting; Josef Kramler, Burgkirchen; Hans-Adolf Gerber, Burghausen, all of Fed. Rep. of Germany

[73] Assignee: Wacker-Chemitronic Gesellschaft Für Elektronik-Grundstoffe mbH, Burghausen, Fed. Rep. of Germany

[21] Appl. No.: 604,301

[22] Filed: Apr. 26, 1984

[30] Foreign Application Priority Data

Jul. 7, 1983 [DE] Fed. Rep. of Germany ....... 3324511

[51] Int. Cl.³ .................... H01L 21/265; B23K 27/00
[52] U.S. Cl. ........................................ 148/1.5; 29/574; 29/576 T; 148/187; 156/644; 427/53.1
[58] Field of Search .................. 148/1.5, 187; 29/574, 29/576 T; 427/53.1; 156/644

[56] References Cited

U.S. PATENT DOCUMENTS

| | | | |
|---|---|---|---|
| 4,137,100 | 1/1979 | Zaleckas | 148/1.5 |
| 4,257,827 | 3/1981 | Schwuttke et al. | 148/1.5 |
| 4,288,528 | 9/1981 | Picquendar et al. | 427/53.1 |
| 4,315,130 | 2/1982 | Inagaki et al. | 219/121 L |
| 4,372,989 | 2/1983 | Menzel | 427/53.1 |
| 4,410,401 | 10/1983 | Anselrode | 427/53.1 |
| 4,434,429 | 2/1984 | Terao et al. | 427/53.1 |
| 4,439,245 | 3/1984 | Wu | 148/1.5 |

FOREIGN PATENT DOCUMENTS 0108287  9/1978  Japan ..................................... 29/574

OTHER PUBLICATIONS

Christ et al. in Symposium on Silicon Processing, (ASTM), San Jose, CA, Jan. 18–22, 1982.
Lemons et al., Appl. Phys. Lett., 40, (1982), 703.
Hasselbeck et al., J. Appl. Phy., 54, (1983), 3626.
Hawkins et al., Appl. Phys. Letts., 42, (1983), 358.
Merkle et al., Appl. Phys. Lett., 40, (1982), 729.
Liv et al., Appl. Phys. Letts., 34, (1979), 864.

*Primary Examiner*—Upendra Roy
*Attorney, Agent, or Firm*—Collard, Roe & Galgano

[57] ABSTRACT

A method for producing contrast rich, permanent and slag-free characterizations, particularly on polished semiconductor disks is described, in which the surface for generating the surface pattern is partially melted by laser radiation. According to the invention, a surface segment corresponding to 1.5 to 6.5 times the surface area of the desired surface pattern is irradiated, and the semiconductor material is caused to melt and partially vaporize only in the center thereof.

5 Claims, 2 Drawing Figures

50μm

10μm

METHOD OF MAKING REFERENCE SURFACE MARKINGS ON SEMICONDUCTOR WAFERS BY LASER BEAM

BACKGROUND OF THE INVENTION

The invention relates to a method for the characterization of semiconductor surfaces by means of surface patterns which are generated by respective melting and partial vaporization of a surface segment of the semiconductor surface by means of a laser beam.

It is known to provide semiconductor surfaces with surface patterns for the characterization thereof by means of laser radiation, and wherein arrangement of the surface patterns with respect to one another results in the formation of desired symbols, such as letters or numerals. Such characters should be rich in contrast and permanent-namely, they should be recognizable in a trouble-free manner, for example, even after several high temperature- and/or oxidation treatments of the respective semiconductor surface without any impairment of their surface quality.

According to a known method, the desired location of the semiconductor surface to be characterized is irradiated by means of high-powered laser pulses, which cause the semiconductor material of the irradiated surface segment to melt, and then cause the melted surface material to almost completely vaporize. In this manner, surface patterns in the shape of dot-like recesses are obtained, which by themselves, are rich in contrast and permanent, but are always surrounded by a rim of melted beads and random deformities (so-called "slag"). In any subsequent processes, for example, an oxidation process, very small particles can break off from this slag, and be subsequently deposited on the semiconductor surface. This, in turn, may finally lead to errors in the semiconductor devices subsequently produced, and, therefore, may lead to a loss in the yield.

This disadvantage is avoided by another known method, in which in the surface segment of the semiconductor material irradiated by the laser pulse is only melted and is no longer vaporized. The so-obtained dot-shaped surface patterns are, it is true, free from any slag, but are poor in contrast, and in view of their short depth, are not very permanent.

A further method, in which complete letters or numerals are generated in a semiconductor surface with the aid of masks by means of a single laser pulse, yields only a non-uniform lettering, which is poor in contrast.

SUMMARY OF THE INVENTION

It is therefore an object of the invention to provide a method which permits the characterization of semiconductor surfaces with surface patterns which are rich in contrast, permanent and free of any slag, and which are generated by laser pulses.

This object is achieved according to the invention by a method which is characterized by the steps of irradiating by means of a laser pulse a surface segment which has a surface area corresponding to 1.5 times to 6.5 times the surface area of the desired surface pattern, and adjusting the energy of the laser pulse so that only in the center of the surface segment, and on a surface corresponding to the surface pattern, the semiconductor material is melted and partially vaporized.

The surfaces of a single-component or of a multicomponent semiconductor material can be characterized, according to this method such as, for example, germanium, gallium arsenide, gallium phosphide, indium phosphide or, especially, silicon.

As the inventive method permits the generation of uniform surface patterns of high precision, and without any impairment of the surface quality, it is particularly suitable for those surfaces, which have already been carefully pretreated, and therefore are qualitatively of a high grade. It is therefore suitable primarily for polished surfaces, but additionally also for surfaces pretreated in another manner, which have a low average roughness value $R_a$ (according to DIN 4768) of less than 0.4 $\mu$m, particularly for acid-etched semiconductor surfaces.

Circular surface patterns having a diameter of 50 to 150 $\mu$m can be generated particularly advantageously according to the inventive method, and, in fact, these circular surface patterns have been proposed and recommended by the "Semiconductor Equipment and Materials Institute" (SEMI) as basic elements for the alphanumerical characterization of silicon disks having a diameter of 100 mm and 125 mm. By means of these dot-like basic elements, the semiconductor surfaces are marked according to the SEMI standard in a precisely predetermined arrangement, so that the desired characterization is obtained by letters, numerals or other symbols.

The form of the surface pattern is primarily determined by the respective oscillation mode or pattern of the laser. The preferred circular surface patterns are generated, for example, when the laser is operated in the fundamental mode ($TEM_{00}$). Basically, operation is also possible in other low index transverse oscillation modes, even if the surface patterns, for instance elliptical surface patterns, resulting therefrom are of no significance for the characterization of semiconductor disks. Hence, in what follows, for the sake of clarity, only the method for the generation of circular-like surface patterns is illustrated, but it can also be readily transferred in an appropriate manner to other shapes or forms of surface patterns.

For carrying out the inventive method, it is desirable to use laser devices in which either the diameter or the pulse energy of the laser beam, or in a particularly advantageous manner, both parameters are adjustable, preferably in a continuous manner. Also advantageous is the use of devices having lenses of a long focal length between 300 and 1000 mm, which permits the irradiation of surface segments having a relatively large surface area.

A selection criterion for selecting a particular radiation source is, of course, the fact that the radiation source must emit a light of a suitable wavelength, namely a wavelength which is absorbed by the semiconductor material to be characterized. Consequently, for a silicon surface advantageously ruby or particularly Nd: YAG-lasers are applicable, which are preferably switched in a Q-factor manner.

An adjustment or setting of the laser pulse energy and of the diameter of the laser beam suitable for characterization is advantageously determined in preliminary tests in relation to the desired surface of the, e.g., circular-shaped surface pattern. For this purpose, generally the beam diameter is so adjusted, that on the selected semiconductor surface, for example, on a polished silicon surface, a surface segment is irradiated, whose surface area corresponds to 1.5 to 6.5 times the surface area of the surface pattern. The irradiated surface segment is understood to be that portion of the surface on which the beam impinges with still at least the $1/e^2$ value (e=Euler's No.) of the maximum energy density (corresponding to about 13.5% of the maximum energy density). As a rule, one irradiates, in the case of small surface patterns, such as a circle having a 50 μm diameter, a surface segment which is a considerable multiple thereof typically corresponding to 4 to 6.5 times the area of the desired surface pattern, while in the case of a large surface pattern having a diameter, for example, greater than 150 μm, irradiation of a surface being only 1.5 to 3.5 times larger yields good results. Here one can work with defocused or, preferably, focused beams.

After the irradiated surface segment has been set or selected in this manner, or in devices without any corresponding adjustment capability, the irradiated surface segment has been predetermined, the energy density of the radiated laser beam is so regulated that the semiconductor material is melted and partially vaporized only in the center of the surface segment, and on a surface corresponding to the desired surface pattern. Here it has been shown particularly advantageous to gradually reduce the energy density, starting from a maximum value, to a suitable lower value. As a rule, further vernier adjustments of the beam diameter, and of the pulse energy are then carried out, until the exact surface pattern is obtained. Also in devices having predetermined energy density, a corresponding matching or tailoring of the parameter can be obtained in most cases by variation of the diameter of the beam.

The respective adjustment can then be maintained during the entire characterization process, generally also in the case of a large number of pieces, where the semiconductor disks or wafers are provided with symbols on their surface in the conventional manner, for example, by means of a laser beam deflected by a galvanometer mirror.

As it is merely required to primarily melt the semiconductor material in the selected surface location, and to cause vaporization only in a small measure, the risk of any contamination by vaporized particles is small, be they on the surface itself, or on neighboring surfaces.

Other objects and features of the present invention will become apparent from the following detailed description considered in connection with the accompanying drawing which discloses one embodiment of the invention. It is to be understood that the drawing is to be used for the purpose of illustration only, and not as a definition of the limits of the invention.

BRIEF DESCRIPTION OF THE DRAWINGS

In the drawings, wherein similar reference characters denote similar elements throughout the several views.

DETAILED DESCRIPTION OF THE PREFERRED EMBODIMENTS

Figure 1:
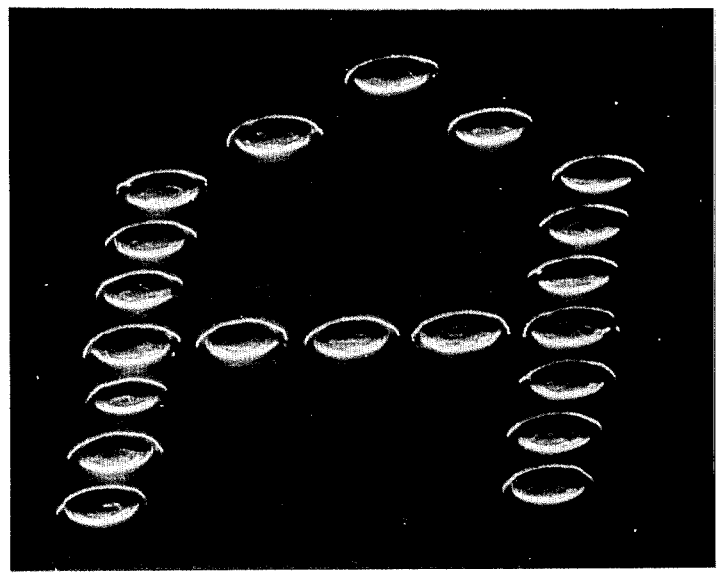
FIG. 1 is a microphotograph of a polished silicon disk which has been treated according to the inventive method.

Turning now in detail to the drawing, FIG. 1 (enlargement 1000 times, photographing angle 65°) shows a typical form of the circular surface patterns obtained. These each exhibit in the center thereof a plate-like region 1 which is recessed with respect to the original surface, generally by 1 μm to 5 μm. The depth of the recesses can be controlled, for example, by the energy density distribution of the irradiated laser pulse; the depth of the recesses will be increased if there is a corresponding increase of the energy density in the center of the pulse.

The recessed region ascends gradually outwardly and finally merges with a ring-shaped or annular bulge 2, which is embossed or raised with respect to the original surface, and which represents the border of the surface pattern. This bulge is formed from melted material, which is urged from an inner region of the surface pattern outwardly. Correspondingly, the bulge is, as a rule, higher, the deeper the center is recessed. In general, a bulge height of at most 1 μm is desired, so as to, for example, avoid any disturbances or impairments during photolithography according to the contact method.

A typical feature of semiconductor surfaces characterized by the inventive method is the extremely fine outer ring 3, which surrounds, at a small spacing, the actual surface pattern consisting of the recessed region 1 and the bulge 2.

Figure 2:
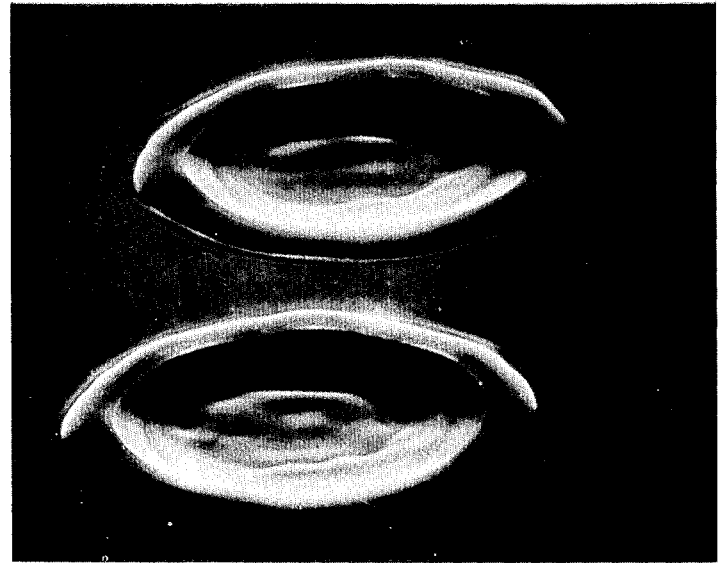
FIG. 2 is a microphotograph of a polished silicon disk which has been treated according to the inventive method, but which shows in a reduced magnification to show the arrangement of the surface patterns in the form of the letter "A".

In FIG. 2 (enlargement 200 times, photographing angle 65°), the circular surface patterns are arranged, for example, into the letter "A"; FIG. 2 shows particularly how uniformly and continuously the surface patterns can be arranged on the semiconuctor surface.

The surface patterns generated according to the inventive method are particularly rich in contrast, as they have, with respect to the surface surrounding them, both uniformly raised, as well as uniformly recessed regions. Moreover, they also have a depth suitable for a high degree of permanence, and are free of any melted beads, deformities, pits or similar surface irregularities.

The invention will now be explained more fully in a number of examples which are, however, only given by way of illustration and not of limitation.

EXAMPLE 1

Polished silicon disks (diameter 100 mm, (111)-orientation) are to be characterized by circular surface patterns of about 75 μm diameter, of about 2 μm depth, and of about 1 μm bulge height.

A Q-factor switched Nd: YAG-laser (wave length 1.06 μm, having a nominal efficiency of 12 watts in $TEM_{00}$-mode at continuous operation) was used, which generated pulses at a half-value duration of about 150 ns at a repetition frequency of 1 kHz. The beam was widened on the output of the laser by a 6X magnifying telescope to a diameter of 5 mm, and wherein only that portion of the beam has been taken into account, in which the $1/e^2$ times value of the maximum energy density had been exceeded.

Then a test disk for determining of suitable parameters was inserted into the holding arrangement provided on the device.

By means of a lens having a 500 mm focal length, the laser beam was then focused onto the disk surface at a diameter of 155 μm. The irradiated surface segment corresponded to about 4.3 times the surface area of the desired surface pattern.

Subsequently, the pulse energy was reduced from its maximum value of 1.8 mJ in a continuous fashion by means of an attenuator, until the melted and partially vaporized region in the center of the surface segment had attained the desired dimensions. This was the case at 0.96 mJ.

With the so determined adjustment values, thereafter 100 polished silicon disks were lettered according to a conventional method (beam deviation by means of two galvanometer mirrors, computer control, variable repetition frequency).

The surface patterns were measured by random sample of the disks obtained. The diameters determined were in the range of 75±5 μm, the bulge heights were in the range of 1.0±0.3 μm, and the depths were in the range of 1.8±0.5 μm. All disks were free of any slag.

Ten of these disks were subsequently each subjected six times to a two hour oxidation in humid oxygen at 1100° C., and subsequently the so-formed oxide was etched with hydrofluoric acid. Thereafter the characters were still readable in a trouble-free manner, and no chipping could be ascertained.

EXAMPLE 2

In an arrangement according to Example 1, ten polished germanium disks (diameter 50 mm, (100)-orientation) were lettered. The diameter of the laser beam was 155 μm, the pulse energy 0.46 mJ.

On the disk surface there were obtained circular surface elements having a diameter in the range 70±5 μm, a bulge height 0.9±0.3 μm, and a depth 1.7±0.5 μm. The letter points were uniformly formed and entirely free of any slag.

While only one embodiment and several examples of the present invention have been described, it is obvious that many changes and modifications may be made thereunto, without departing from the spirit and scope of the invention.

What is claimed is:

1. In a method for the characterization of semiconductor surfaces by means of surface patterns, which are each generated by melting and partial vaporization of a surface segment by means of a laser pulse, the improvement comprising the steps of:

irradiating by means of a laser pulse a surface segment of the semiconductor surface whose surface area corresponds to 1.5 to 6.5 times the surface area of the desired surface pattern; and adjusting the energy of the laser pulse so that melting and partial vaporization of the semiconductor material takes place only in the center of said surface segment on a surface of the semiconductor material corresponding to the desired surface pattern.

2. The method of claim 1, wherein the irradiated semiconductor surfaces having an average roughness value, according to DIN 4768, of at most 0.4 μm.

3. The method of claim 1 wherein said irradiating and adjusting steps result in the generation of circular recesses as said surface patterns having a diameter ranging from 50 to 150 μm.

4. The method of claim 1, wherein said circular recesses each have, relative to the original semiconductor surface, a raised annular rim and a recessed center.

5. The method of claim 1, wherein said surface segment of said semiconductor material is melted and partially vaporized to a depth of from 1 to 5 μm.

* * * * *

UNITED STATES PATENT AND TRADEMARK OFFICE
CERTIFICATE OF CORRECTION

PATENT NO. : 4,522,656
DATED : JUNE 11, 1985
INVENTOR(S) : FRANZ KUHN-KUHNENFELD ET AL

It is certified that error appears in the above—identified patent and that said Letters Patent is hereby corrected as shown below:

Cover page, item [30], Foreign Application Priority Data, foreign application no. should read --3324551--.

Signed and Sealed this

Seventeenth Day of December 1985

[SEAL]

Attest:

DONALD J. QUIGG

Attesting Officer

Commissioner of Patents and Trademarks